(12) United States Patent
Hwang et al.

(10) Patent No.: US 6,316,340 B1
(45) Date of Patent: Nov. 13, 2001

(54) PHOTOLITHOGRAPHIC PROCESS FOR PREVENTING CORNER ROUNDING

(75) Inventors: Jiunn-Ren Hwang, Hsinchu; I-Hsiung Huang, Kaohsiung, both of (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/721,148

(22) Filed: Nov. 22, 2000

(51) Int. Cl.⁷ .................................................. H01L 21/425
(52) U.S. Cl. ................................................ 438/524; 438/947
(58) Field of Search .................................... 438/524, 530, 438/531, 535, 589, 692, 795, 799, 947, 948, 949

(56) References Cited

U.S. PATENT DOCUMENTS 5,124,927 * 6/1992 Hopewell et al. .................... 364/468
5,413,898 * 5/1995 Kim et al. ............................ 430/325
5,756,256 * 5/1998 Nakato et al. ..................... 430/272.1
5,955,244 * 9/1999 Duval ................................... 430/314

* cited by examiner

*Primary Examiner*—David Nelms
*Assistant Examiner*—David Nhu
(74) *Attorney, Agent, or Firm*—Charles C. H. Wu; Charles C. H. Wu & Associates

(57) ABSTRACT

A photolithographic process for preventing the rounding of the corners of a pattern. A silicon wafer is provided. A first photoresist layer is formed over the silicon wafer and then patterned to form a first group of mutually parallel photoresist lines along a first direction. A second photoresist layer is formed over the silicon wafer and then patterned to form a second group of mutually parallel photoresist lines along a second direction. The first direction and the second direction are on the same plane but mutually perpendicular.

15 Claims, 3 Drawing Sheets

PHOTOLITHOGRAPHIC PROCESS FOR PREVENTING CORNER ROUNDING

BACKGROUND OF THE INVENTION

1. Field of Invention

The present invention relates to a photolithographic process in semiconductor manufacturing. More particularly, the present invention relates to a photolithographic process capable of preventing the rounding of the corners in a pattern.

2. Description of Related Art

Following the rapid increase in the level of integration, integrated circuits are now designed with decreasing feature dimensions. In the fabrication of semiconductors, one very important manufacturing step is photolithographic process. All metal-oxide semiconductor (MOS) devices related processes such as thin film patterning or dopants implantation are conducted by performing photolithographic processes. Ultimately, the fabrication of integrated circuits with a line width smaller than $0.18 \mu m$ depends on the future development of photolithography. To reduce size of semiconductor devices, resolution of photomask in photolithographic process must be increased. Recent development in this direction includes optical proximity correction (OPC) and phase shift mask (PSM).

Optical proximity correction is at present one of the principle methods of eliminating critical dimension deviation due to proximity effect. Proximity effects occur when a light beam passing through a photomask with a pattern thereon is projected onto the surface of a silicon chip. In the process, the light rays may be diffracted by the photomask so that a portion of the light rays may diverge. Furthermore, some of the light passing into the photoresist layer above the silicon chip may be reflected by the semiconductor substrate of the silicon chip to cause interference. Hence, a portion of the photoresist layer may be repeatedly exposed leading to undesirable variation in photoresist exposure.

FIG. 1A is a top view of a conventional photomask with a trench array pattern for manufacturing trench capacitors. FIG. 1B is a top view of the pattern on a silicon wafer after photolithographic processing with the photomask shown in FIG. 1A.

As shown in FIG. 1A, a trench pattern 102 is formed on a photomask 100. For example, if the trench pattern 102 is a trench pattern for forming trench capacitors, width 102a and length 102b of separation between neighboring trenches are different. In other words, pattern density in the horizontal and the vertical directions are different and hence corresponding intensity and strength of exposure requirements are different. Due to proximity effect, differences in the edge length and edge width of the trenches will limit the process window of the photolithographic process.

In addition, due to proximity effect, the corners of pattern is somewhat rounded leading to pattern distortion when the trench pattern 102 on the photomask 100 is transferred to the silicon wafer 104 to form an opening pattern 106.

To reduce proximity effect, subsidiary patterns are often formed around the trench pattern on the photomask. However, as device dimensions shrink and the level of integration increases, line width becomes increasingly narrow and there is limited area around the device pattern for forming a subsidiary pattern. Consequently, cost of fabricating the photomask is increased. Moreover, as line width of a pattern shrinks, the limited resolution of a stepping machine will further reduce the process window for forming an opening pattern on a silicon wafer using photolithographic process.

SUMMARY OF THE INVENTION

Accordingly, one object of the present invention is to provide a photolithographic process for preventing the rounding of the corners of a pattern. The process includes the following steps. First, a silicon wafer is provided. A first photoresist layer is formed over the silicon wafer and then patterned to form a first group of mutually parallel photoresist lines along a first direction. Thereafter, a second photoresist layer is formed over the silicon wafer and then patterned to form a second group of mutually parallel photoresist lines along a second direction. The first direction and the second direction are on the same plane but mutually perpendicular.

Since mutually perpendicular first and second group of photoresist lines is formed in separate processes, the pattern formed by the first and the second group of photoresist lines is different from a conventional opening pattern. Hence, the rounding of corners due to proximity effect will be prevented and the difficulties in producing subsidiary pattern around fine and highly integrated pattern using optical proximity correction method will be minimized. In some cases, even the subsidiary pattern is no longer required on a photomask.

In addition, separately formed first and second photoresist lines has a resolution much higher than the resolution of an opening pattern formed by a direct conventional process. Moreover, a photomask having a linear pattern will have smaller exposure diffraction and a larger depth of focus when transferring the linear pattern to a photoresist layer. Hence, a larger process window for photolithography is obtained.

After the patterned first photoresist lines has undergone such processes as soft-baking, light-exposure, post-exposure baking and photoresist-developing, there is very little intermixing with subsequent patterning of the second photoresist lines. Therefore, using this type of multiple resist pattern stacking method to form a series of mutually perpendicular pattern of photoresist above a silicon wafer, corner rounding and pattern distortion due to proximity effect can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 2A is also a cross-sectional view along line 2A–2A' of FIG. 3A; FIG. 2B is also a cross-sectional view along line 2B–2B' of FIG. 3B.

DESCRIPTION OF THE PREFERRED EMBODIMENTS

Figure 1A:
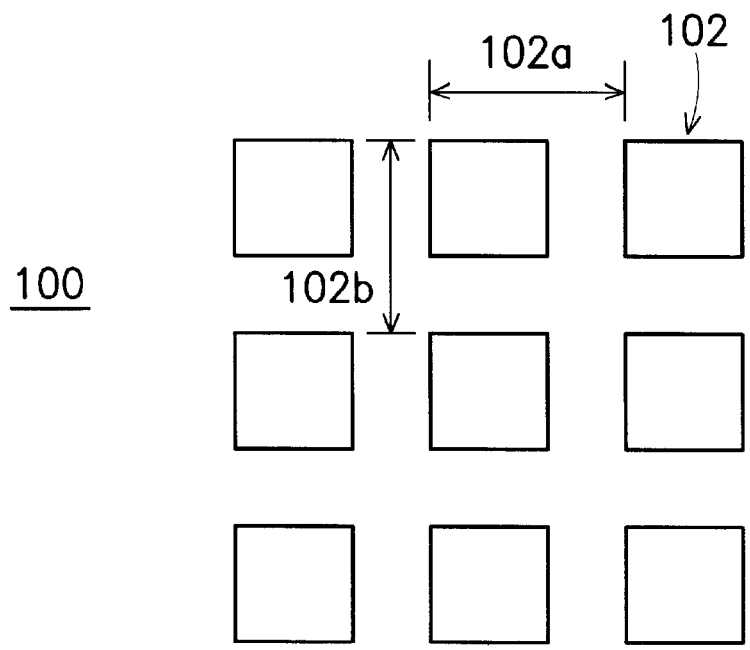
FIG. 1A is a top view of a conventional photomask with a trench array pattern for manufacturing trench capacitors.
Figure 1B:
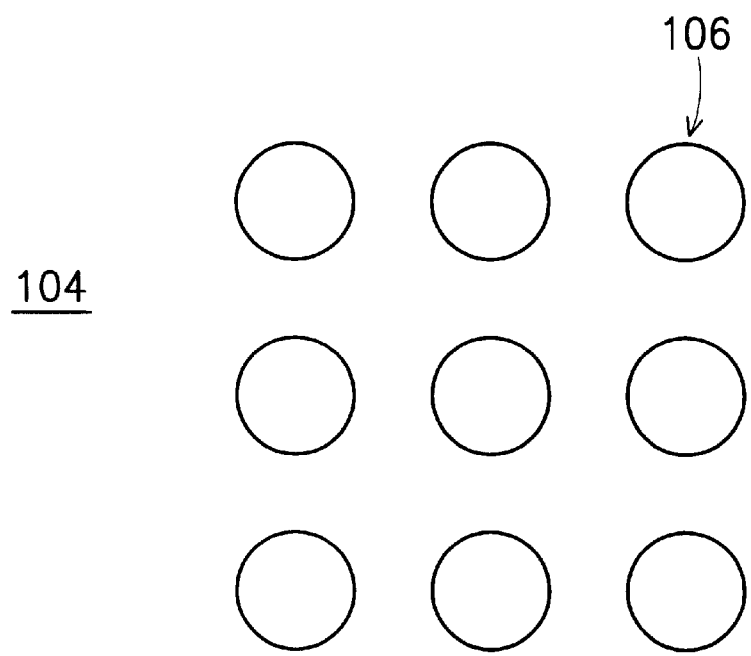
FIG. 1B is a top view of the pattern on a silicon wafer after photolithographic processing with the photomask shown in FIG. 1A.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
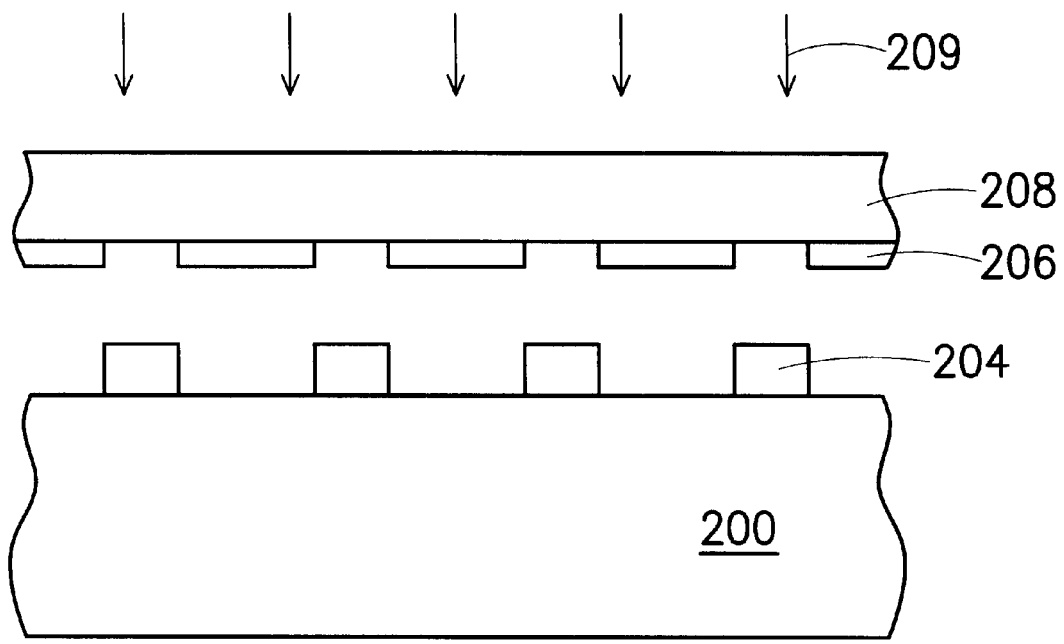
FIGS. 2A and 2B are schematic cross-sectional views showing the progression of steps in a photolithographic process for producing a multiple resist pattern stack according to one preferred embodiment of this invention.
Figure 2B:
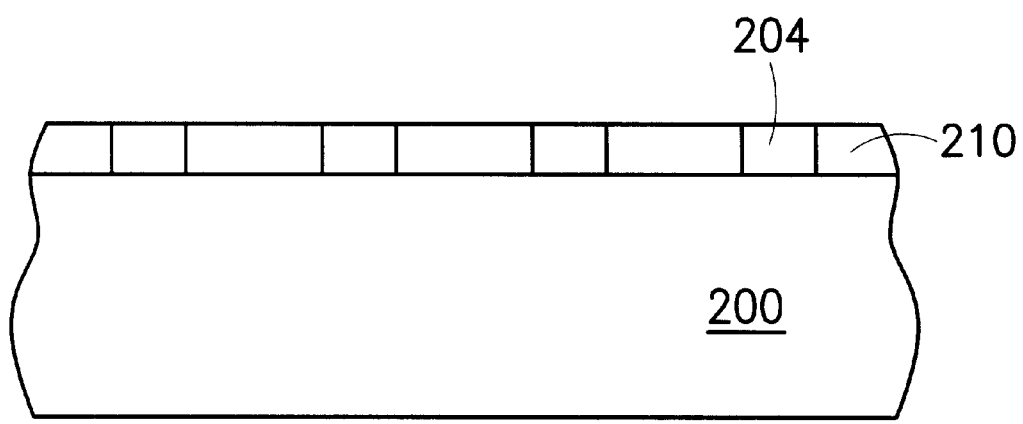
Figure 3A:
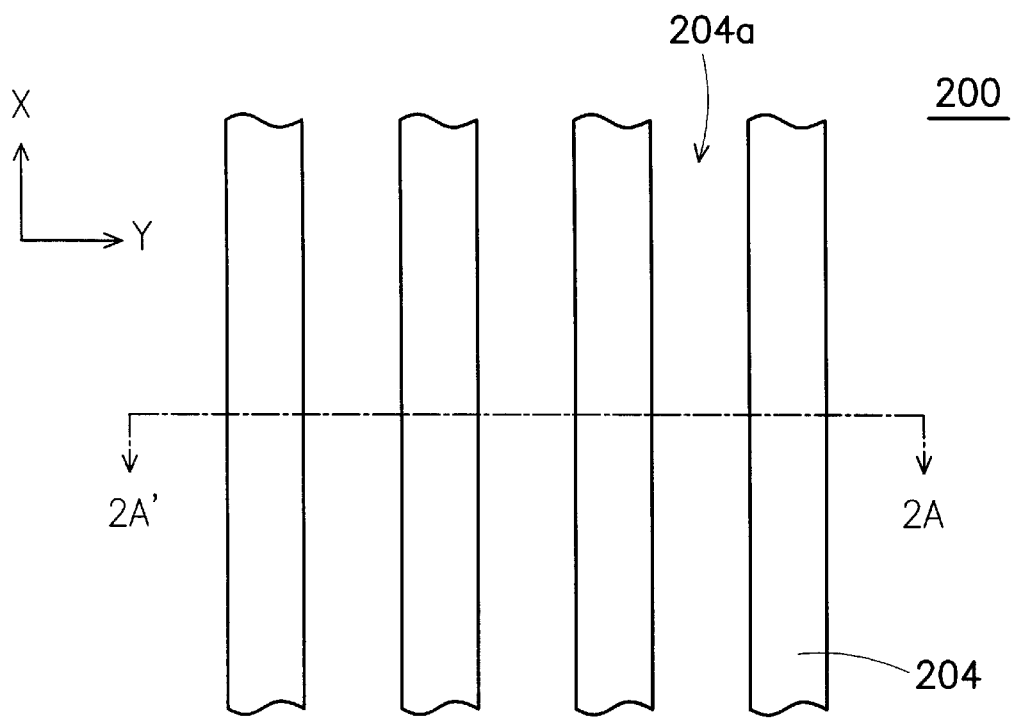
FIG. 3A is a top view of FIG. 2A, in fact.
Figure 3B:
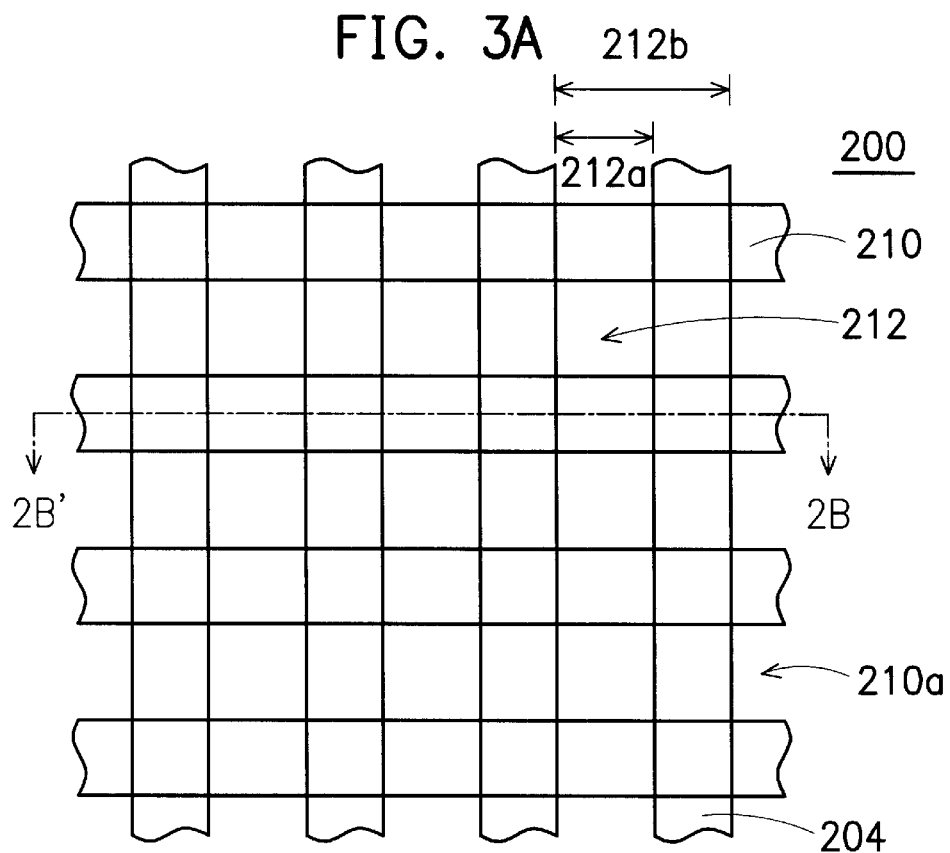
FIG. 3B is a top view of FIG. 2B, in fact.

In this invention, a trench array for forming trench capacitors is used as an illustration. FIGS. 2A and 2B are schematic cross-sectional views showing the progression of steps in a photolithographic process for producing a multiple resist pattern stack according to one preferred embodiment of this invention. FIG. 3A is a top view of FIG. 2A, in fact, FIG. 2A is also a cross-sectional view along line 2A–2A' of FIG. 3A. FIG. 3B is a top view of FIG. 2B, in fact, FIG. 2B is also a cross-sectional view along line 2B–2B' of FIG. 3B.

As shown in FIGS. 2A and 3A, a silicon wafer 200 is provided. The silicon wafer includes a plurality of semiconductor devices (not shown) and a plurality of conductive layers and dielectric layers (not shown). A patterned photoresist layer 204 is formed over the silicon wafer 200. The patterned photoresist layer 204 comprises of a series of mutually parallel photoresist lines running along a direction X such that a linear space 204a separates each photoresist line (as shown in FIG. 3A).

The photoresist 204, for example, can be a positive resist or a negative resist. Preferably, a deep ultraviolet resist is used. A negative resist is used in the embodiment of this invention. The patterned photoresist layer 204 is formed, for by depositing a photoresist layer (not shown) over the silicon wafer 200. A soft-baking process is next carried out to remove any solvent in the photoresist layer so that a greater resist adhesion and a greater selectivity between exposed and unexposed resist with respect to a particular developing agent is obtained. A resist exposure process 209 is conducted so that the linear pattern 208 on a photomask 206 is transferred to the photoresist layer. The photomask 206 can be a clear field mask or a dark field mask, for example. In this embodiment, the photomask 206 is a clear field mask. In the subsequent step, a post-exposure baking process is carried out and then the photoresist layer is developed to form the photoresist lines 204.

As shown in FIGS. 2B and 3B, another patterned photoresist layer 210 is formed over the silicon wafer 200. The patterned photoresist layer 210 comprises of a series of mutually parallel photoresist lines running along a direction Y such that a linear space 210a separates each photoresist line (as shown in FIG. 3B). Both direction X and Y are on the same plane, but they are mutually perpendicular to each other. In other words, each photoresist line 210 crosses each photoresist line 204 perpendicularly.

The photoresist 210, for example, can be a positive resist or a negative resist. Preferably, a deep ultraviolet resist is used. The patterned photoresist layer 210 is formed, for example, by depositing a photoresist layer (not shown) over the silicon wafer 200. A soft-baking process is next carried out. A resist exposure process is conducted so that the linear pattern 208 on a photomask 206 is transferred to the photoresist layer. A post-exposure baking process is next carried out and then the photoresist layer is developed to form the photoresist lines 210. The patterned photoresist layers 204 and 210 together form an opening pattern 212. When deep ultraviolet resist is used to form both the photoresist layer 204 and 210, trench capacitors having a minimum line width 212a of about 0.1μm and a minimum pitch separation 212b of about 0.3μm are formed.

Compared with a conventional opening pattern, the linear pattern has a higher resolution. Moreover, linear pattern on the photomask produces the least diffraction during photoresist exposure and has the greatest depth of focus (DOF). Hence, overall process window in the transfer of a linear pattern to a photoresist layer is larger.

Since mutually perpendicular patterned photoresist lines 204 and photoresist lines 210 are formed in separate processes, the opening pattern 212 formed by the photoresist lines 204 and the photoresist lines 210 is different from a conventional opening pattern. Thus, the rounding of pattern corners due to proximity effect can be avoided and the difficulties in producing subsidiary pattern around fine and highly integrated pattern using optical proximity correction method can be minimized. In some cases, even the subsidiary pattern is no longer required on a photomask.

After the patterned photoresist lines 204 has undergone such processes as soft-baking, light-exposure, post-exposure baking and photoresist-developing, there is very little intermixing with subsequent patterning of the second photoresist lines. Therefore, using this type of multiple resist pattern stacking method to form a series of mutually perpendicular pattern of photoresist above a silicon wafer, corner rounding and pattern distortion due to proximity effect can be avoided.

In this embodiment, a trench array for forming trench capacitors is used in the illustration. In practice, the invention can be applied to via opening and contact opening as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photolithographic process for preventing the rounding of the corners of a pattern, comprising the steps of:
   providing a silicon wafer;
   forming a first photoresist layer over the silicon wafer;
   patterning the first photoresist layer to form a set of mutually parallel photoresist lines along a first direction;
   forming a second photoresist layer over the silicon wafer; and
   patterning the second photoresist layer to form a set of mutually parallel photoresist lines along a second direction, wherein the first direction and the second direction are on the same plane but mutually perpendicular.

2. The process of claim 1, wherein the first photoresist layer includes a positive photoresist layer.

3. The process of claim 1, wherein the first photoresist layer includes a negative photoresist layer.

4. The process of claim 1, wherein the first photoresist layer includes a deep ultraviolet photoresist layer.

5. The process of claim 1, wherein the second photoresist layer includes a positive photoresist layer.

6. The process of claim 1, wherein the second photoresist layer includes a negative photoresist layer.

7. The process of claim 1, wherein the second photoresist layer includes a deep ultraviolet photoresist layer.

8. A photolithographic process for preventing the rounding of the corners of a pattern, comprising the steps of:
   providing a silicon wafer;

forming a first photoresist layer over the silicon wafer;
conducting a first baking operation;
conducting a first photo-exposure operation;
conducting a first post-exposure baking operation;
developing the first photoresist layer to pattern the first photoresist layer into a set of mutually parallel photoresist lines along a first direction;
forming a second photoresist layer over the silicon wafer;
conducting a second baking operation;
conducting a second photo-exposure operation;
conducting a second post-exposure baking operation; and
developing the second photoresist layer to pattern the second photoresist layer into a set of mutually parallel photoresist lines along a second direction; wherein the first direction and the second direction are on the same plane.

9. The process of claim 8, wherein the first direction and the second direction are mutually perpendicular.

10. The process of claim 8, wherein the first photoresist layer includes a positive photoresist layer.

11. The process of claim 8, wherein the first photoresist layer includes a negative photoresist layer.

12. The process of claim 8, wherein the first photoresist layer includes a deep ultraviolet photoresist layer.

13. The process of claim 8, wherein the second photoresist layer includes a positive photoresist layer.

14. The process of claim 8, wherein the second photoresist layer includes a negative photoresist layer.

15. The process of claim 8, wherein the second photoresist layer includes a deep ultraviolet photoresist layer.

* * * * *